United States Patent [19]

Kizaki et al.

[11] Patent Number: 5,160,747
[45] Date of Patent: Nov. 3, 1992

[54] APPARATUS FOR MANUFACTURING CERAMIC CHIP-RESISTANT CHAMFERED INTEGRATED CIRCUIT PACKAGE

[75] Inventors: Takayasu Kizaki; Chong-il Park; Reiichi Yamada, all of San Diego, Calif.

[73] Assignee: Kyocera America, Inc., San Diego, Calif.

[21] Appl. No.: 740,807

[22] Filed: Aug. 5, 1991

Related U.S. Application Data

[62] Division of Ser. No. 595,310, Oct. 10, 1990, Pat. No. 5,095,360.

[51] Int. Cl.$^5$ ...................... B29C 43/32; B29C 43/02
[52] U.S. Cl. ..................................... 425/352; 425/406
[58] Field of Search .............. 425/351, 352, 353, 354, 425/355, 357, 406, 412

[56] References Cited

U.S. PATENT DOCUMENTS

| | | | |
|---|---|---|---|
| 1,587,431 | 6/1926 | Seybold | 425/351 |
| 1,887,993 | 11/1932 | Conner et al. | 425/351 |
| 2,306,205 | 12/1942 | Crossman | 425/351 |
| 2,380,659 | 7/1945 | McDougal | 425/355 |
| 3,868,201 | 2/1975 | Jacobsen et al. | 425/406 |
| 4,755,128 | 7/1988 | Alexander | 425/351 |

FOREIGN PATENT DOCUMENTS

| | | | |
|---|---|---|---|
| 1284345 | 11/1968 | Fed. Rep. of Germany | 425/406 |
| 58-00396 | 1/1983 | Japan | 425/352 |

*Primary Examiner*—Willard Hoag
*Attorney, Agent, or Firm*—Spensley Horn Jubas & Lubitz

[57] ABSTRACT

A ceramic chip-resistant chamfered integrated circuit package and an apparatus for and method of manufacture thereof. The exposed-surface edge of each short end of a ceramic package component (base and/or cap) are made with an integral chamfer at an angle of from about 20° to about 85° relative to the plane of the opposing inner surface of the component. The height H of the chamfer is from about 20% to about 67% of the thickness T of the ceramic package component. In particular, the preferred angle of the chamfer is from about 50° to about 70°, with a preferred height H of about 30% to about 50% of the thickness T. The integral chamfer of each ceramic package component is made by means of an inventive die-press apparatus for inverted formation of the ceramic package component. The inventive method forms the chamfers without causing localized compaction of the ceramic powder starting material.

3 Claims, 4 Drawing Sheets

APPARATUS FOR MANUFACTURING CERAMIC CHIP-RESISTANT CHAMFERED INTEGRATED CIRCUIT PACKAGE

This is a division of application Ser. No. 07/595,310, filed on Oct. 10, 1990 now U.S. Pat. No. 5,095,360.

BACKGROUND OF THE INVENTION

1. Field of the Invention

This invention relates to ceramic integrated circuit packages, and more particularly to a ceramic chip-resistant chamfered integrated circuit package and an apparatus for and method of manufacture thereof.

2. Description of Related Art

Plastic and ceramic packages have long been used in the industry to hermetically house and protect electronic integrated circuits (IC's). More recently, ceramic packages have become the package of choice for large IC's due to the generally superior properties (including heat resistance) of ceramics over plastics.

FIG. 1 shows a prior art ceramic package. The ceramic package comprises a relatively thick rectangular base 1 and a matching relatively thin rectangular cap 2 bonded together by a sealing material 3 such as glass. Connecting pins 4 embedded in the sealing material 3 provide electrical contacts to an IC housed within the ceramic package.

However, one aspect of ceramic packages that is inferior to plastic packages is susceptibility to chipping. While the ceramic materials used in ceramic packages are very hard, such materials also tend to be brittle. During manufacture, handling, and use, especially in automated equipment, ceramic packages often are handled in groups, and frequently hit each other. In particular, ceramic packages are often stacked end-to-end in handling tubes, where the surfaces most susceptible to chipping are positioned for repeated striking as the tubes are moved around, or as the ceramic packages move within the tubes. As a consequence, chipping of the ends of ceramic packages is not uncommon.

Chipping of a ceramic piece can be defined as a fast fracture initiated and completed within the vicinity of a surface, edge, or corner of the piece. A fast fracture in ceramic materials involves a stress concentrator within the ceramic material (such as a micro-crack, micro-void, or inclusion) and an external stress applied to the ceramic that is less than the general yielding stress for the defect-free ceramic. A sufficient external stress causes catastrophic failure of the ceramic around and near the stress concentrator, leading to a complete fracture.

Most chips occur at edges and corners, which are the weakest points of a ceramic package. Smaller chips occur more frequently because a smaller amount of energy is required to fracture the ceramic. Referring to FIG. 1, leading types of chips include bulk chips 5 (i.e., involving relatively large chunks of fractured ceramic, such as broken corners), flakes 6 (relatively flat pieces from surfaces), and silvers 7 (relatively small pieces from edges). Flakes 6 and silvers 7 are the most common types of chips that occur during use and handling of ceramic packages in handling tubes. (Also shown in FIG. 1 is an orientation notch A common to most ceramic packages).

Chipping is considered to be a problem in the electronics industry because chipped packages are susceptible to further chipping, and ultimately failure of the hermetic environment of the housed IC. In addition, customers for such IC's prefer to have undamaged ceramic packages for cosmetic reasons.

Many efforts have been made to reduce the number of stress concentrators in ceramic packages. Unfortunately, today's ceramics still contain micro-voids despite various combinations of materials and manipulations of the microstructure during manufacture.

Therefore, a need exists for a ceramic package design that is chip resistant, particularly with respect to end-to-end strikes. In the past, attempts have been made to apply "bumper" tapes to the ends of ceramic packages to prevent end-strike chips during handling. The bumper tapes are typically removed afterwards. However, applying and then removing bumper tapes is time-consuming and relatively expensive. Another technique in common use is to form one or more "steps" 8 on exposed-surface edges (see FIG. 1). This primarily protects against chipping due to random hits by creating multiple hitting points, thus spreading the energy of a strike. However, edge steps do not appreciably reduce chips caused by multiple end-strikes.

Rounding corners and making the components (cap and/or base) of a ceramic package thicker reduces chipping, particularly bulk chips, but does not significantly reduce flaking and silvering caused by end-strikes.

Another approach to reducing end-strike chips that was attempted some years ago was to mechanically grind chamfers into the exposed-surface edges of each short end of a ceramic package (before or after firing) at an angle of about 67°. However, such machining is time-consuming, expensive, and wasteful of material.

Thus, a need exists for an economical and effective method of manufacturing ceramic packages that are chip resistant, particularly with respect to end-to-end strikes. The present invention provides such a design, and an apparatus and method for manufacturing the design.

SUMMARY OF THE INVENTION

The present invention is a ceramic chip-resistant chamfered integrated circuit package and an apparatus for and method of manufacture thereof. The exposed-surface edge of each short end of a ceramic package component (base and/or cap) is made with an integral chamfer at an angle of from about 20° to about 85° relative to the plane of the opposing inner surface of the component. The height H of the chamfer is from about 20% to about 67% of the thickness T of the ceramic package component. In particular, the preferred angle of the chamfer is from about 50° to about 70°, with a preferred height H of about 30% to about 50% of the thickness T.

The integral chamfer of each ceramic package component is made by means of an inventive die-press apparatus for inverted formation of the ceramic package component. The inventive method forms the chamfers without causing localized compaction of the ceramic powder starting material.

The details of the preferred embodiment of the present invention are set forth below. Once the details of the invention are known, numerous additional innovations and changes will become obvious to one skilled in the art.

BRIEF DESCRIPTION OF THE DRAWINGS

Like numbers and designations in the drawings refer to like elements.

DETAILED DESCRIPTION OF THE INVENTION

Throughout this description, the preferred embodiment and examples shown should be considered as exemplars, rather than limitations on the structure and method of the present invention.

Figure 2A:
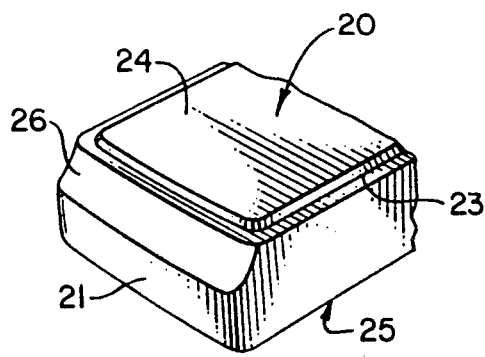
FIG. 2a is a perspective view of the un-notched end of a chamfered ceramic package component made in accordance with the present invention.
Figure 2B:
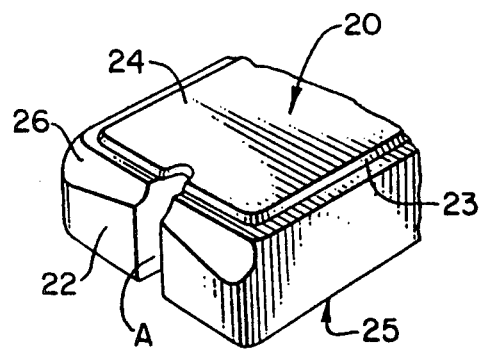
FIG. 2b is a perspective view of the notched end of a chamfered ceramic package component made in accordance with the present invention.

FIG. 2a is a perspective view of the un-notched "short" end 21 of a chamfered ceramic package component 20 made in accordance with the present invention. FIG. 2b is a perspective view of the other end 22 of the component 20, showing an orientation notch A. The component 20 may be a ceramic package base or cap (a cap is shown by way of example).

Figure 1:
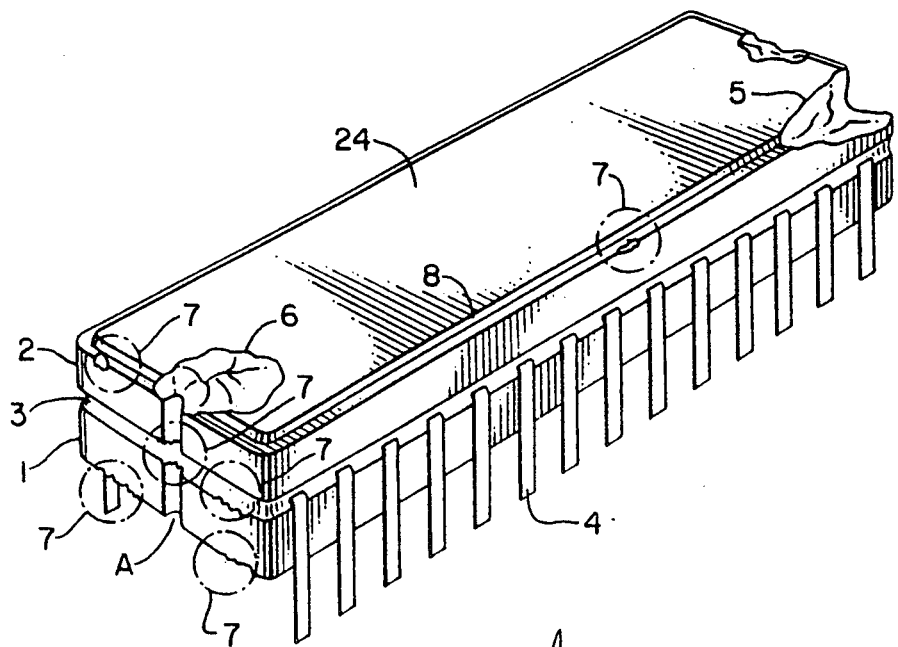
FIG. 1 is a perspective view of the front, side, and top of a prior art ceramic package showing different types of chips.

The component 20 has an exposed surface 24 opposite an inner surface 25. The exposed surface 24 forms part of the exterior surface of a finished ceramic package similar to the package shown in FIG. 1. The exposed surface 24 is generally parallel to the inner surface 25. Each end 21, 22 is approximately perpendicular to the exposed surface 24. The component 20 shown also has a double stepped edge 23 around its perimeter.

Figure 3A:
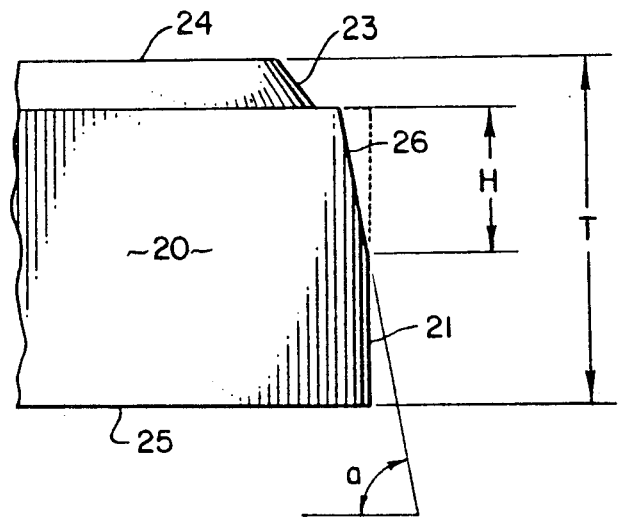
FIG. 3a is a side elevation view of a high-angle chamfered ceramic package component made in accordance with the present invention.
Figure 3B:
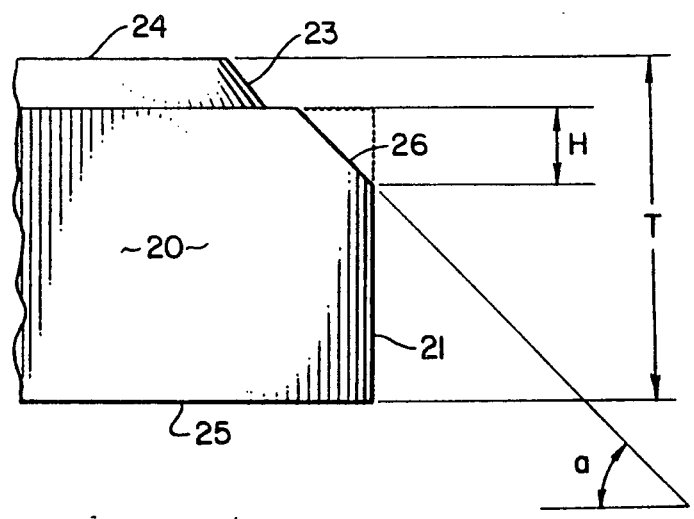
FIG. 3b is a side elevation view of a low-angle chamfered ceramic package component made in accordance with the present invention.

The invention comprises integrally forming a chamfer 26 on the edge defining the juncture of the exposed surface 24 and a respective end 21, 22 of the component 20. The chamfer is made at an angle of from about 20° (low angle) to about 85° (high angle) relative to the plane of the inner surface 25 of the component. FIG. 3a is a side elevation view of a high-angle chamfered ceramic package component made in accordance with the present invention, having an angle of about 80°. FIG. 3b is a side elevation view of a low-angle chamfered ceramic package component made in accordance with the present invention, having an angle of about 45°. The preferred angle of the chamfer is from about 50° to about 70°.

The height H (see FIGS. 3a and 3b) of each chamfer is from about 20% to about 67% of the thickness T of the ceramic package component 20. The preferred height H is about 30% to about 50% of the thickness T.

Figure 4:
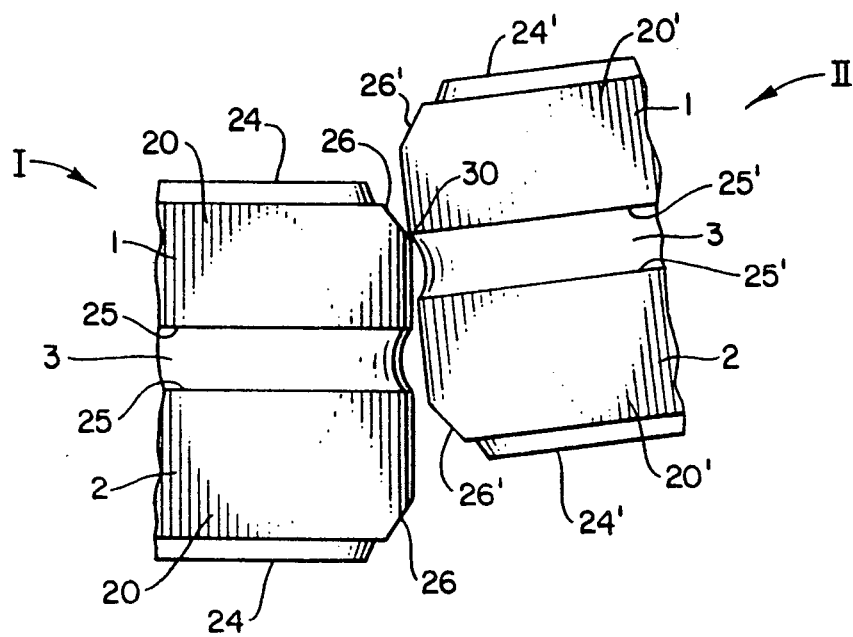
FIG. 4 is a side view of two ceramic packages made in accordance with the present invention, shown striking end-to-end.

FIG. 4 is a side view of two ceramic packages I and II made in accordance with the present invention, shown striking end-to-end. Each ceramic package I, II comprises a base 1 affixed by sealing material 3 to a cap 2. A point 30 on ceramic package II is shown striking the chamfer 26 of ceramic package I. Stress is therefore applied to the chamfer surface of ceramic package I.

Figure 5:
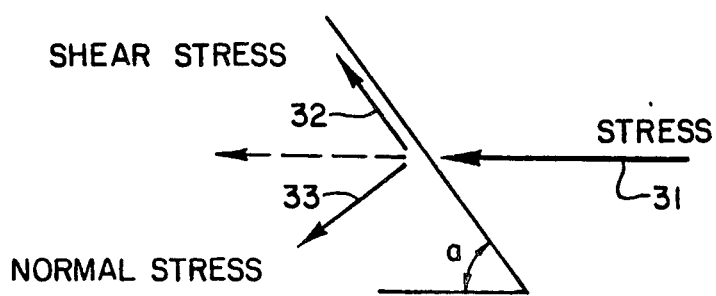
FIG. 5 is a diagram showing the normal and shear stresses on a chamfered ceramic package component made in accordance with the present invention.

FIG. 5 diagrammatically shows the vector components of the applied stress 31 as a normal stress 32 and a shear stress 33. As indicated, the applied stress 31 is dissipated into two directions. If the stress 31 is applied at a 45° angle to the surface of the chamfer 26, the energy will be equally divided between the normal stress 32 and the shear stress 33. If the stress 31 is applied at a angle to the ceramic between 45° and 90°, the energy will be directed more to the normal stress 32 than to the shear stress 33. It has been found that more flaking occurs under such conditions. Conversely, if more energy is directed along the shear stress 33, the surface of the ceramic is less likely to flake.

Experimental results of forming an integral chamfer 26 on a ceramic package component 20 in accordance with the present invention indicate a significant improvement in chip resistance, particularly for low-angle chamfers.

EXPERIMENT I

In the first experiment, two sets of twenty-four 28-lead assemblies of two bases affixed together were tested. For each set, six subsets of four assemblies were placed end-to-end in handling tubes. Six handling tubes contained four control assemblies made from standard base components. Six handling tubes contained four assemblies made from chamfered base components made in accordance with the present invention, with a chamfer angle of about 67° and a chamfer height H to component thickness T of about 30%.

The handling tubes were rocked back and forth (one cycle) 40 times at around 50° from a horizontal plane to cause end-to-end collisions of the assemblies contained therein. The number of eye-visible chips of at least approximately 0.030 inches across in each assembly was then counted. The control assemblies showed flake type chips around the end notches and sliver type chips on the inner surface edges. The chamfered assemblies showed sliver type chips on the inner surface edges. The results for 40 cycles are shown in Table I. Significantly, the chamfered assemblies did not show flake or bulk type chips up to about 700 cycles.

TABLE I

| NUMBER OF VISIBLE CHIPS OF ALL TYPES | | |
| --- | --- | --- |
| NUMBER OF CYCLES: | 20 | 40 |
| CONTROL ASSEMBLIES: | 30 | 58 |
| CHAMFERED ASSEMBLIES: | 0 | 4 |

EXPERIMENT II

In the second experiment, three sets of twelve 40-lead assemblies of a cap and base affixed together were tested. For each set, three subsets of four assemblies were placed end-to-end in handling tubes. Three handling tubes contained four control assemblies made from standard components. Three handling tubes contained four assemblies made from chamfered components made in accordance with the present invention, with a chamfer angle of about 70° and a chamfer height H to component thickness T of about 40%. Three handling tubes contained four assemblies made from chamfered components made in accordance with the present invention, with a chamfer angle of about 67° and a chamfer height H to component thickness T of about 40%.

The handling tubes were rocked back and forth (one cycle) 40 times at around 50° from a horizontal plane to cause end-to-end collisions of the assemblies contained therein. The number of eye-visible chips of at least approximately 0.030 inches across in each assembly was then counted. The control assemblies showed flake type chips around the end notches. The 70°-angle chamfered assemblies showed more flake-type chipping than the 67°-angle chamfered assemblies. All assemblies showed sliver type chips on the inner surface edges. The results for 40 cycles are shown in Table II. Significantly, the 67°-angle chamfered assemblies did not show flake or bulk type chips up to about 200 cycles.

TABLE II

| NUMBER OF VISIBLE CHIPS OF ALL TYPES | | |
| --- | --- | --- |
| NUMBER OF CYCLES: | 20 | 40 |
| CONTROL ASSEMBLIES: | 17 | 33 |
| 70°-ANGLE CHAMFERED ASSEMBLIES: | 15 | 30 |
| 67°-ANGLE CHAMFERED ASSEMBLIES: | 2 | 6 |

The invention also encompasses an economical apparatus for and method of manufacturing ceramic packages having integral end chamfers of the type described above. This aspect of the invention is best understood by comparing the apparatus and method to the prior art.

Figure 6A:
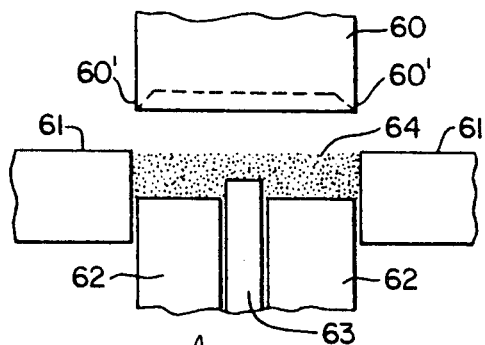
FIG. 6a is a diagrammatic side view of a prior art press and die apparatus and method for making a ceramic package component, showing the initial powder-fill stage.
Figure 6B:
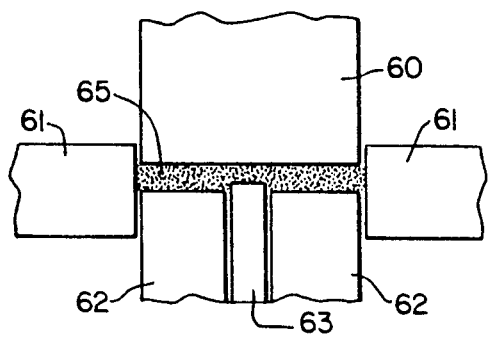
FIG. 6b is a diagrammatic side view of a prior art press and die apparatus and method for making a ceramic package component, showing the pressing stage.
Figure 6C:
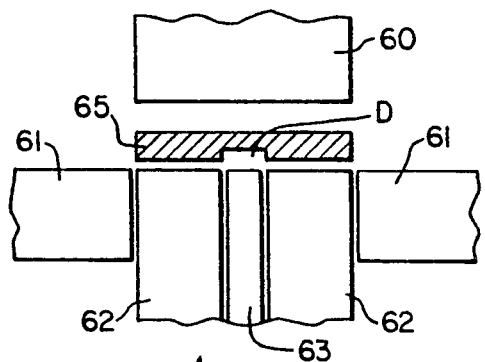
FIG. 6c is a diagrammatic side view of a prior art press and die apparatus and method for making a ceramic package component, showing the ejection stage.

FIGS. 6a–6c are diagrammatic views of a prior art press and die apparatus and method for making a ceramic package component. The apparatus comprises a top punch 60, a die case 61, a bottom punch 62, and a floating punch 63. The die case 61 defines the basic outer shape of a ceramic package component (cap or base). For formation of a base, the floating punch 63 is typically initially raised above the bottom punch 62 to a first level to approximately define a depression D (see FIG. 6c) for attachment of an IC. For formation of a cap, the floating punch is also often initially raised above the bottom punch 62 to define a depression D' (not shown) matching the position of the die attach depression D. FIG. 6a shows an initial powder-fill stage. The die case 61 is filled with a portion of a ceramic powder 64, in known fashion. The ceramic powder is then pressed by the top punch 60 to form a compacted ceramic package component 65 (FIG. 6b). The bottom punch 62 and floating punch 63 are then raised to the top of the die case 61 to eject the final-form compacted component (FIG. 6c), which may then be fired.

Initially raising the floating punch 63 to a first level above the bottom punch 62 helps to compensate for differences in the depth of the ceramic powder 64 throughout the die case 61. During the pressing stage, the height of the floating punch 63 above the bottom punch 62 is gradually lowered to a second level that defines the final-form depth of the depression D (or D') of the component, in known fashion. This insures that the density of the component is uniform as the ceramic powder 64 is compacted, despite the differences in thickness of the various parts of the component. A uniform density across the entire component is required to prevent differential thermal and mechanical stresses on the component that may cause warping or fracture.

The integral chamfers of the ceramic package component described above cannot be properly made with the prior art apparatus and method shown in FIGS. 6a–6c. If the top punch 60 is altered to conform to the required shape of the end chamfers, as shown by the dotted line in FIG. 6a, the resulting acute edges 60' of the top punch will cause the ceramic powder 64 to be locally over-compressed at the corresponding short-end edges of the component. The component will therefore lack uniform density.

Accordingly, the present invention modifies the prior art apparatus and method in order to properly manufacture a ceramic package component in accordance with the present invention. The integral chamfer of each ceramic package component is made by means of a novel die-press apparatus for inverted formation of the ceramic package component. The inventive method forms the chamfers without causing localized compaction of the ceramic powder starting material.

Figure 7A:
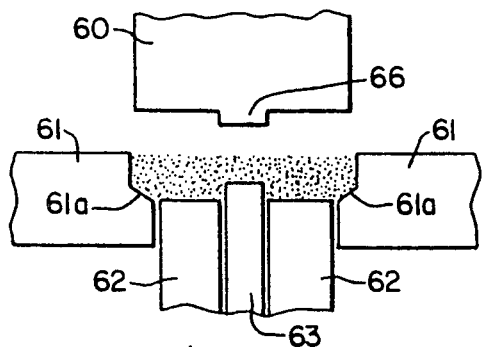
FIG. 7a is a diagrammatic side view of the inventive press and die apparatus and method for making a ceramic package component, showing the initial powder-fill stage.
Figure 7B:
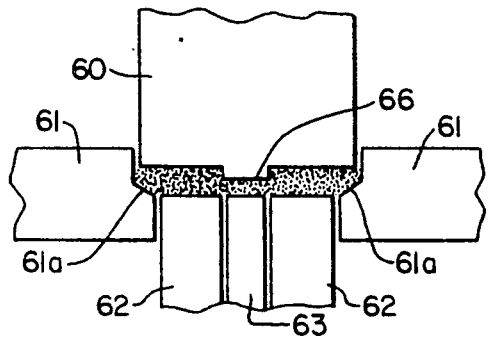
FIG. 7b is a diagrammatic side view of the inventive press and die apparatus and method for making a ceramic package component, showing the pressing stage.
Figure 7C:
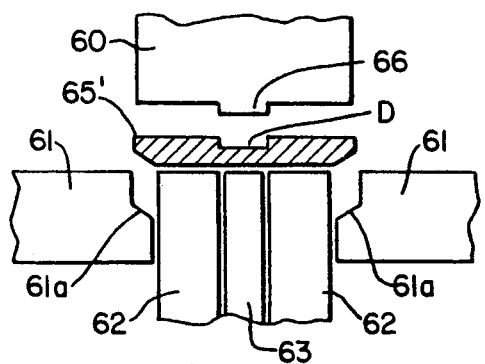
FIG. 7c is a diagrammatic side view of the inventive press and die apparatus and method for making a ceramic package component, showing the ejection stage.

FIGS. 7a–7c are diagrammatic views of the inventive press and die apparatus and method for making a chamfered-end ceramic package component. The apparatus comprises a top punch 60, a die case 61, a bottom punch 62, and a floating punch 63. As in the prior art, the die case 61 defines the basic outer shape of a ceramic package component (cap or base). However, the sides walls 61a of the die case 61 are shaped to conform to the desired chamfer angle and chamfer depth.

For formation of a base or cap having a depression D or D', the floating punch 63 is typically intially raised above the bottom punch 62 to a first level. Initially raising the floating punch 63 helps to compensate for differences in the depth of the ceramic powder 64 throughout the die case 61. However, the floating punch 63 does not directly define the depression D or D'. Instead, the top punch 60 is formed with a boss 66 that defines the desired depression D or D'. Thus, a ceramic package component made by the press and die apparatus of FIGS. 7a–7c is inverted during formation compared to a ceramic package component made by the prior art apparatus shown in FIGS. 6a–6c.

FIG. 7a shows an initial powder-fill stage. The die case 61 is filled with a portion of a ceramic powder 64, in known fashion. The ceramic powder is then pressed by the top punch 60 to form a compacted chamfered ceramic package component 65', typically having a depression D or D' (FIG. 7b). The bottom punch 62 and floating punch 63 are then raised to the top of the die case 61 to eject the final-form compacted component (FIG. 7c), which may then be fired.

During the pressing stage, the height of the floating punch 63 above the bottom punch 62 is gradually lowered to be approximately flush with the bottom punch 62. This insures that the density of the component is uniform as the ceramic powder 64 is compacted, despite the differences in thickness of the various parts of the component.

The present invention thus provides an economical and effective apparatus for and method of manufacturing chamfered-end ceramic packages that are resistant to chipping from end-strikes.

A number of embodiments of the present invention have been described. Nevertheless, it will be understood that various modifications may be made without departing from the spirit and scope of the invention. For example, the side edges of a ceramic package component may also be chamfered in accordance with the present invention. Further, edge-steps may also be formed at the exposed-surface edge of a chamfer to provide further protection from random strikes to a package. Accordingly, it is to be understood that the invention is not to be limited by the specific illustrated embodiment, but only by the scope of the appended claims.

We claim:

1. An apparatus for making a ceramic chip-resistant integrated circuit package component with at least one integrally-formed end chamfer, the component having an exposed surface, an opposing inner surface, and opposing end surfaces, the apparatus including a die press for forming the ceramic component, the die press having a floating punch, a top punch having a horizontal surface including a boss means for defining a depression within the final form of the component for accommodating an integrated circuit, wherein the boss coincides with the floating punch, a bottom punch, and a die case conforming to the general shape of the component and having at least one chamfered end wall, the chamfer having:

a. an angle of from about 20° to about 85° relative to the plane of the horizontal surface of the top punch; and
   b. a height H that is from about 20% to about 67% of the vertical distance between the top punch and the bottom punch with the top punch in a position maintained when the ceramic component is being fully compressed.

2. The invention of claim 1, wherein the angle of the chamfer is from about 50° to about 70° relative to the plane of the horizontal surface of the top punch.

3. The invention of claim 1, wherein the height H of the chamfer is about 30% to about 50% of the vertical distance between the top punch and the bottom punch with the top punch at the end of the top punches downward travel.

* * * * *